United States Patent
Niu et al.

(10) Patent No.: US 7,064,611 B2
(45) Date of Patent: Jun. 20, 2006

(54) $I_{DSS}$ RF AMPLIFIER

(75) Inventors: Dow-Chih Niu, Taipei (TW);
Chia-Yang Chen, Hsinchu (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 12 days.

(21) Appl. No.: 10/753,721

(22) Filed: Jan. 8, 2004

(65) Prior Publication Data

US 2004/0201424 A1    Oct. 14, 2004

(51) Int. Cl.
*H03F 3/16*    (2006.01)
(52) U.S. Cl. ...................................... 330/277; 330/310
(58) Field of Classification Search ................ 330/277, 330/302, 306, 307, 310, 311
See application file for complete search history.

(56) References Cited

U.S. PATENT DOCUMENTS

| | | | | |
|---|---|---|---|---|
| 5,229,732 A | * | 7/1993 | Furutani et al. | 330/277 |
| 5,532,646 A | * | 7/1996 | Aihara | 330/279 |
| 5,745,009 A | * | 4/1998 | Leroux et al. | 330/277 |
| 5,745,857 A | * | 4/1998 | Maeng et al. | 455/553.1 |
| 5,789,983 A | * | 8/1998 | Fujita | 330/277 |
| 5,914,641 A | * | 6/1999 | Yun et al. | 330/302 |
| 5,986,503 A | * | 11/1999 | Ichikawa | 330/277 |
| 6,054,902 A | * | 4/2000 | Masato | 330/306 |
| 6,121,840 A | * | 9/2000 | Sakusabe | 330/277 |
| 6,249,186 B1 | * | 6/2001 | Ebihara et al. | 330/277 |
| 6,329,879 B1 | * | 12/2001 | Maruyama et al. | 330/289 |
| 6,759,906 B1 | * | 7/2004 | Matsunaga et al. | 330/285 |

* cited by examiner

*Primary Examiner*—Linh V. Nguyen
(74) *Attorney, Agent, or Firm*—J.C. Patents

(57) ABSTRACT

A single-power-supply Idss-bias RF amplifier is disclosed, which is composed by the first and second stages Amplifiers. The two stages have the same circuit topology except matching circuits. The source terminal of amplifier is grounded directly to reduce a parasitic effect from a bias circuit. It will increase the stability of the RF amplifier and avoid an oscillation. The lossy matching circuits and eliminating resonator circuit are designed to make the RF amplifier unconditional stable. A variable resister is put into to adjust a D.C. voltage on the drain terminal. The current of amplifier could be controlled in a reasonable range. High gain and quit low noise have been obtained.

7 Claims, 3 Drawing Sheets

$I_{DSS}$ RF AMPLIFIER

BACKGROUND OF THE INVENTION

1. Field of the Invention

The present invention relates to a RF amplifier, and more particularly to an $I_{DSS}$ (saturated drain to source current) RF amplifier adapted to a communication system.

2. Description of the Related Art

Traditional military RF frequency amplifiers are made by thin film technology. This expensive technology makes RF amplifiers become high cost components. Because of the mass-production requirement, most RE amplifiers of the modem communication systems are manufactured on printed circuit boards to reduce costs. The penalty is an oscillation resulted from the parasitic effect of bias circuits. There are two ways widely used to supply a DC power in designing a RF amplifier, a dual-bias circuit and a self-bias circuit The former makes the design of RF amplifier complex, and the later enhances oscillation easily.

To improve the gain and sensitivity, usually the RF amplifier is used as a low noise amplifier (LNA) which determines the noise figure of the whole receiver. The LNA is the most essential and important component in a receiver system.

To achieve a larger gain, in general, the RF amplifier includes two stages of amplifiers. It causes more power consumption and system instability. To design a RF amplifier with a simple bias circuit with a high stability, it is a quite big challenge for microwave engineers.

Accordingly, the prior art amplifier of the communication system has following disadvantages:

1. Because of the parasitic effect of a resistor and a capacitor of the bias circuit, noises and oscillation are easily generated in a self-bias amplifier of the receiver.

2. The prior art amplifier usually uses the dual-bias which requires a DC to DC converter to generate negative supply bias.

SUMMARY OF THE INVENTION

Therefore, an object of the present invention is to provide an $I_{DSS}$ RF amplifier, which can avoid the prior art oscillation effect and reduce the complexity and the cost of the RF amplifier.

The present invention discloses an $I_{DSS}$ RF amplifier, which is adapted for a receiver of a communication system. The amplifier is composed by two stages, a first and a second stage amplifiers. The first stage amplifier has a first transistor with the source terminal grounded. The second stage amplifier has the same topology as the first stage except matching circuits.

According to the preferred $I_{DSS}$ RF amplifier of the present invention, the gate terminal of the first transistor is grounded by a first RF choke. The drain terminal of the first transistor is grounded by series of a fourth resistor and a first capacitor. At the same drain terminal, the first resistor in series with a second RE choke is connected to a fist DC power supply. At the node between the first resistor and the second RF choke, a second capacitor is grounded. The output port of the first stage amplifier is connected to a third capacitor and a third resistor.

According to the preferred $I_{DSS}$ RF amplifier of the present invention, the gate terminal of the second stage amplifier is ground by a third RF choke. The drain terminal of the second stage amplifier is grounded by series of a fifth resistor and a fourth capacitor. At the same drain terminal, the second resistor in series with a fourth RF choke is connected to a second DC power supply. At the node between the second resistor and the fourth RF choke, a fifth capacitor is grounded. The drain terminal of the second stage amplifier is connected to the next circuit by a sixth capacitor.

The $I_{DSS}$ RF amplifier of the present invention uses $I_{DSS}$ as the bias current, so the gate of the transistor is connected to the ground by the first RF choke. There is no resistor existed between the source terminal and the ground. It reduce the parasitic effects of the resistor to avoid the unwanted oscillation that the prior art often generates. Moreover, the first stage amplifier is connected to the second stage amplifier through the third resistor which acts as an attenuator to reduce the gain of the amplifier and increase the stability.

In order to make the aforementioned and other objects, features and advantages of the present invention understandable, a preferred embodiment accompanied with figures is described in detail below.

DESCRIPTION OF SOME EMBODIMENTS

Figure 1:
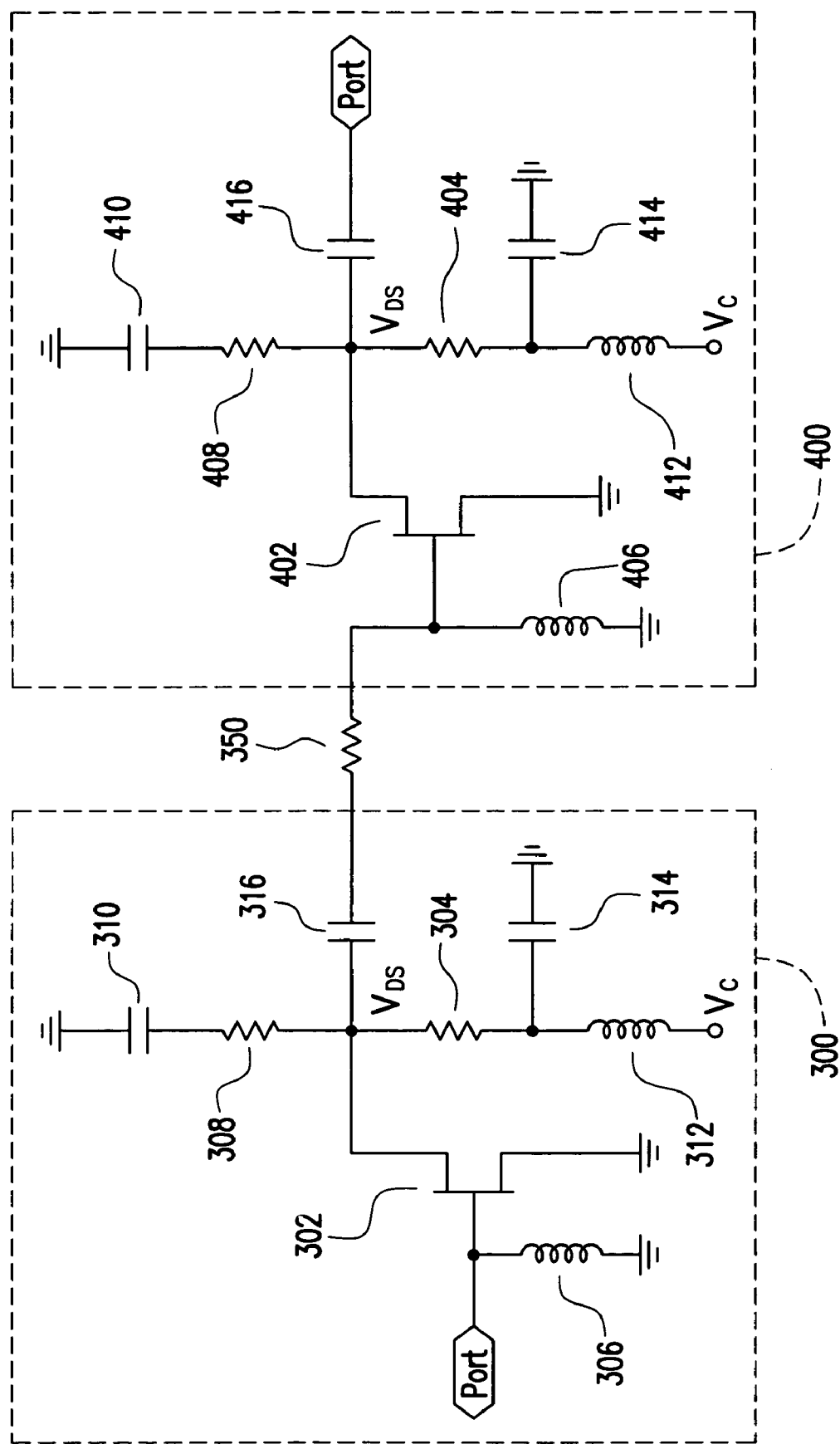
FIG. 1 is a schematic diagram of $I_{DSS}$ RF amplifier of the present invention.

FIG. 1 is a schematic diagram showing a preferred $I_{DSS}$ RF amplifier of the present invention. Referring to FIG. 1, a microwave amplifier comprises a first stage amplifier 300 and a second stage amplifier 400. The first stage 300 has a first transistor 302 with the source terminal of the first transistor 302 grounded. The second stage amplifier 400 has a second transistor 402 with the source terminal of the second transistor 402 grounded.

According to the preferred $I_{DSS}$ RF amplifier of the present invention, the gate terminal of the first transistor 302 of the amplifier 300 is grounded by a first RF choke 306. The drain terminal of the first transistor 302 is grounded by series of a fourth resistor 308 and a first capacitor 310. At the same drain terminal, the resistor 304 in series with a third RF choke 312 is connected to a first DC power supply Vc. The node between the resistor 304 and the third RF choke 312 is grounded by the a second capacitor 314. The drain terminal of the first stage amplifier 300 is connected to the gate terminal of the next stage by a third capacitor 316 and a third resistor 350.

According to the preferred $I_{DSS}$ RF amplifier of the present invention, the first and the second transistors 302 and 402 could be a high frequency field effect transistor, such as MESFET and HEMT.

According to the preferred $I_{DSS}$ RF amplifier of the present invention, the input terminal of the second amplifier 400 is grounded by a second RF choke 406. The drain terminal of the second transistor 402 of the second stage amplifier 400 is grounded by series of a fifth resistor 408 and a fourth capacitor 410. At the same drain terminal, a second resistor 404 in series with a fourth RF choke 412 is connected to a second DC power supply Vc. The node between the second resistor 404 and the fourth RF chock 412 is grounded by a fifth capacitor 414. The drain terminal of the second transistor 402 is connected to a sixth capacitor 416.

According to the preferred IDSS RF amplifier of the present invention, the fourth resistor 308 and the first capacitor 310 of the first stage amplifier 300, and the fifth resistor 408 and the fourth capacitor 410 of the second stage 400 are lossy matching circuits, so as to increase the stability of the RF amplifier.

According to the preferred $I_{DSS}$ RF amplifier of the present invention, the first resistor 304 and the second capacitor 314 of the first stage amplifier 300, and the second resistor 404 and the fifth capacitor 414 of the second stage 400 are designed to eliminate the resonator effect which is generated by the third RF chock 312 and the fourth RF chock 412 to make the RF amplifier unconditional stable.

According to the preferred $I_{DSS}$ RF amplifier of the present invention, the power supply Vc, is about 5V. The $V_{DS}$ (drain to source) voltage of the first stage amplifier 300 can be adjusted by the first variable resistor 304. Similarly, the VDs voltage of the second stage amplifier 400 can be adjusted by the second variable resistor 404 to improve a S/N ratio and control the drain current.

According to the preferred $I_{DSS}$ RF amplifier of the present invention, the first stage amplifier 300 is connected to the second amplifier 400 by the third resistor 350. The third resistor 350 works as an attenuator to reduce the gain and avoid an oscillation.

Figure 2:
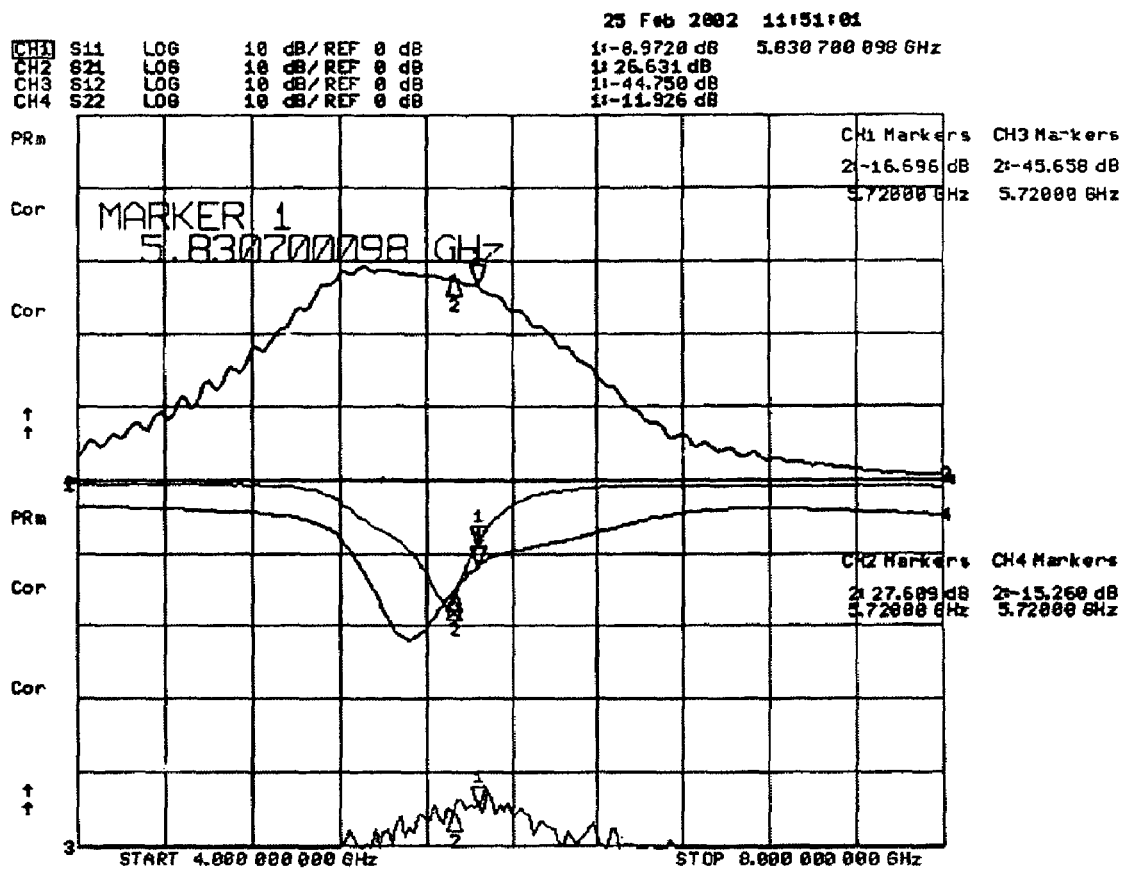
FIG. 2 is a measured S parameter of the preferred embodiment of the present invention.
Figure 3:
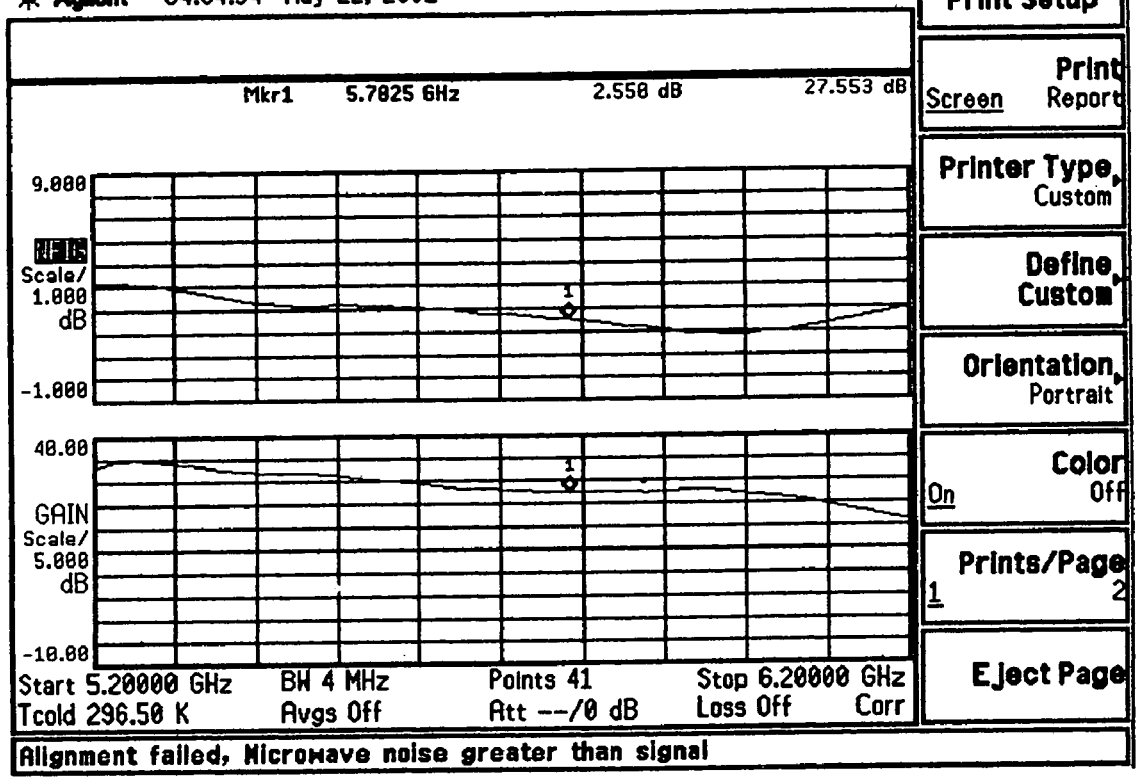
FIG. 3 is a measurement of noise figure of the preferred loss RF amplifier of the present invention.

FIG. 2 is a measured S parameter of the preferred embodiment of the present invention. FIG. 3 is a measured noise figure of the preferred $I_{DSS}$ RF amplifier of the present invention. The RF amplifier is realized by a 20-mil printed circuit board (dielectric constant 3.38). Its working range is from 5.2-6.0 GHz. The gain of single stage is over 13 dB at around 5.8 GHz. The gain of whole amplifier is over 25 dB and the noise figure is lower than 2.5 dB at around 5.8 GHz.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A $I_{DSS}$ RF amplifier, comprising:
    a first stage amplifier having a first transistor, comprising the grounded source terminal and the gate terminal grounded through a first choke; and
    a second stage amplifier having a second transistor, comprising the grounded source terminal and the gate terminal grounded through a second choke;
    wherein the first and the second stage amplifier have the same topology except matching circuits, the first choke and the second choke do not include bypass capacitors so that the gate terminals of the first transistor and the second transistor are grounded in DC paths, as well as the drain terminal of the first transistor is grounded by series of a fourth resistor and a first capacitor, and further is connected to a first DC power supply through a first resistor and a second RF choke in which a node between the first resistor and the second RF choke is grounded by a second capacitor.

2. The $I_{DSS}$ RF amplifier of claim 1, wherein an output terminal of the first stage amplifier is connected to the gate terminal of the second transistor through a third capacitor and a third resistor.

3. The $I_{DSS}$ RF amplifier of claim 2, wherein the first resistor is a variable resistor to adjust a voltage of the drain terminal of the first transistor.

4. The $I_{DSS}$ RF amplifier of claim 3, wherein the first transistor and the second transistors are high frequency field effect transistors, such as MESFETs and HEMTs.

5. The $I_{DSS}$ RF amplifier of claim 4, wherein a drain terminal of the second transistor is grounded by a fifth resistor and a fourth capacitor.

6. The IDSS RF amplifier of claim 5, wherein the drain terminal of the second transistor further is connected to a second DC power supply through a second resistor and a fourth RF choke, and a node between the second resistor and the fourth RF choke is grounded by a fifth capacitor.

7. The $I_{DSS}$ RF amplifier of claim 6, wherein the drain terminal of the second transistor is connected to a sixth capacitor which is blocking capacitor.

* * * * *